United States Patent
Moscatelli et al.

(10) Patent No.: US 10,228,193 B2
(45) Date of Patent: Mar. 12, 2019

(54) PASSIVE COOLING SYSTEM USING A DUAL-PHASE FLUID, PARTICULARLY FOR COOLING ELECTRONIC APPARATUSES, SUCH AS AVIONIC APPARATUSES

(71) Applicant: LEONARDO S.p.A., Rome (IT)

(72) Inventors: Antonio Moscatelli, Turin (IT);
Pierpaolo Borrelli, Acerra (Napoli) (IT); Antonio Romano, Caserta (IT)

(73) Assignee: LEONARDO S.p.A., Rome (IT)

( * ) Notice: Subject to any disclaimer, the term of this patent is extended or adjusted under 35 U.S.C. 154(b) by 0 days.

(21) Appl. No.: 15/848,604

(22) Filed: Dec. 20, 2017

(65) Prior Publication Data

US 2018/0172358 A1  Jun. 21, 2018

(30) Foreign Application Priority Data

Dec. 21, 2016 (IT) .................. 102016000129385

(51) Int. Cl.
| | | |
|---|---|---|
| *F28D 15/00* | (2006.01) | |
| *F28D 15/02* | (2006.01) | |
| *F28D 15/04* | (2006.01) | |
| *H05K 7/20* | (2006.01) | |
| *F28D 21/00* | (2006.01) | |

(52) U.S. Cl.
CPC ......... *F28D 15/0266* (2013.01); *F28D 15/04* (2013.01); *F28D 15/043* (2013.01); *H05K 7/20681* (2013.01); *F28D 2021/0021* (2013.01); *F28D 2021/0028* (2013.01)

(58) Field of Classification Search
CPC .... F28D 15/0266; F28D 15/04; F28D 15/043; F28D 2021/0021; F28D 2021/0028; H05K 7/20681; F24F 3/147; B01D 53/268; F22B 1/066

USPC ...................................... 165/104.26
See application file for complete search history.

(56) References Cited

U.S. PATENT DOCUMENTS

| | | | |
|---|---|---|---|
| 4,216,821 A * | 8/1980 | Robin | ............. F22B 1/066 165/11.1 |
| 5,697,428 A | 12/1997 | Akachi | |
| 6,539,731 B2 * | 4/2003 | Kesten | ............. B01D 53/268 62/271 |
| 7,758,671 B2 * | 7/2010 | Kesten | ............. B01D 53/229 95/43 |
| 2006/0146496 A1 | 7/2006 | Asfia et al. | |

(Continued)

FOREIGN PATENT DOCUMENTS

EP        2887788 A2     6/2015

*Primary Examiner* — Davis D Hwu
(74) *Attorney, Agent, or Firm* — Arent Fox LLP; Michael Fainberg

(57) ABSTRACT

The cooling system comprises: at least one plate member forming a wall of a casing inside which the electronic apparatus to be cooled is accommodated in use, the plate member having a first side facing in use towards the apparatus and a second side opposite to the first side; and a fluid circuit formed in the plate member, wherein the fluid circuit comprises a first duct formed on the first side of the plate member and extending along a first labyrinth path and a second duct formed on the second side of the plate member and extending along a second labyrinth path. The plate member has a first through hole and a second through hole through which the first duct and the second duct are in in fluid communication with each other.

2 Claims, 2 Drawing Sheets

(56) References Cited

U.S. PATENT DOCUMENTS

2007/0144574 A1    6/2007  Yada
2015/0000871 A1    1/2015  Farner et al.
2017/0010006 A1*  1/2017  Kim ..................... F24F 3/147

* cited by examiner

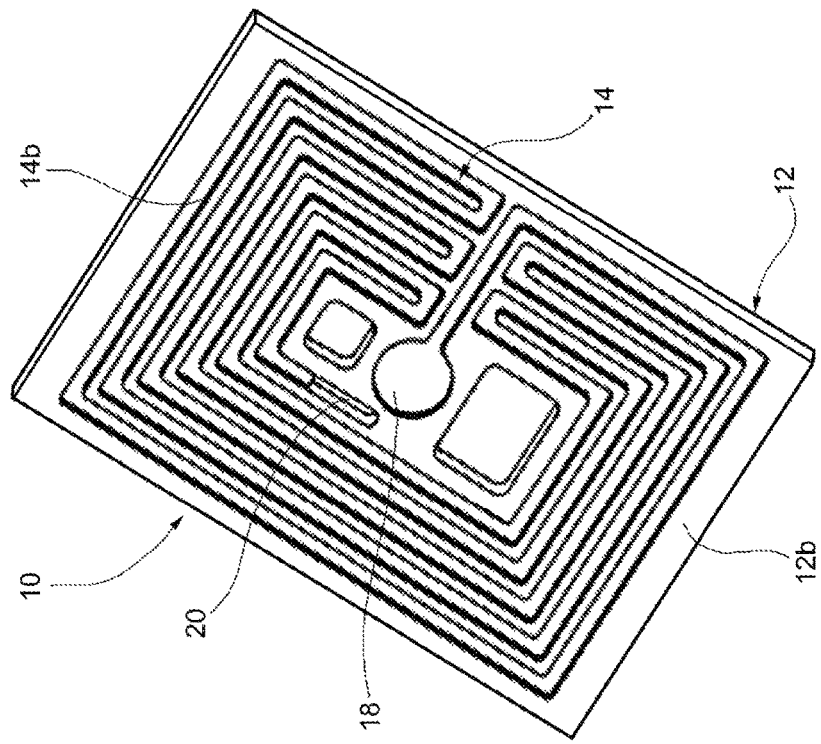
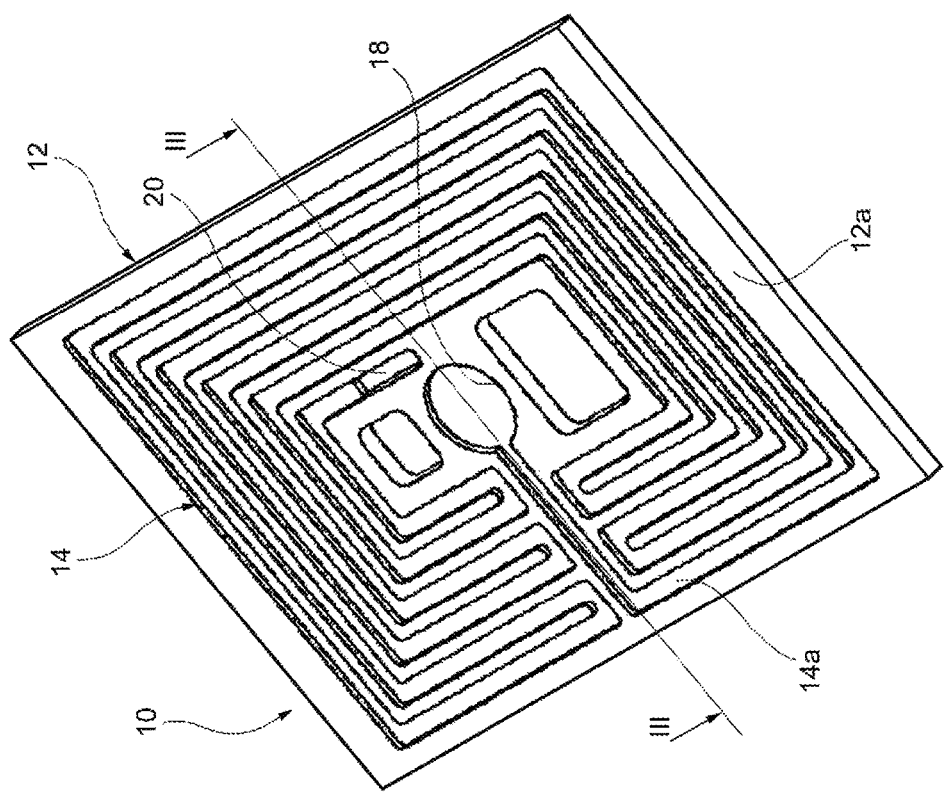
FIG. 1
FIG. 2

PASSIVE COOLING SYSTEM USING A DUAL-PHASE FLUID, PARTICULARLY FOR COOLING ELECTRONIC APPARATUSES, SUCH AS AVIONIC APPARATUSES

CROSS-REFERENCE TO RELATED APPLICATIONS

This application claims priority to Italian Patent Application No. 102016000129385 filed on Dec. 21, 2016. The entire contents of which is hereby incorporated in its entirety by reference.

BACKGROUND OF THE INVENTION

The present invention relates to a cooling system, intended to be used in particular for cooling electronic apparatuses, such as avionic apparatuses.

A cooling system of the above-mentioned type is known from EP 2 887 788.

Air or liquid cooling systems are typically used to dissipate the heat generated by electronic apparatuses, such as for example avionic apparatuses mounted on aircrafts. Such cooling systems are active systems, as they use components (e.g. fans, pumps, etc.) that have to be supplied by electric power in order to operate.

Dual-phase fluid cooling systems, the so-called LHP (Loop Heat Pipe) circuits, are also known. Such cooling systems are passive systems, i.e. they do not require power supply to operate. As is known, a LHP circuit basically comprises an evaporator device having a first portion and a second portion that contain the dual-phase fluid and communicate with each other through a porous separation element. In the first portion, that acts as a tank or compensating chamber, the fluid is in liquid phase, while in the second portion, that acts as the actual evaporator and is placed, to this end, in contact with a body to be cooled so as to receive heat from that body, the fluid is in vapour phase. The fluid flows by capillarity from the first portion to the second portion of the evaporator device passing through the porous separation element and then returns back from the second portion to the first one flowing in a conduit and through a condenser device (made for example as a coil), where transformation from vapour phase to liquid phase occurs.

Aircrafts expected to fly in years 2020-2025 will use more electric power and have more electronic circuits mounted on the same board than the current ones. Accordingly, the heat dissipation density will be higher than the current one, in the order of 100 W/cm$^2$. There is therefore a need to develop cooling systems for cooling electronic apparatuses, in particular avionic apparatuses, that allow to dissipate larger heat quantities than the current dual-phase fluid cooling systems, without however negatively affecting their characteristics in terms of size, mass, energy consumption, safety and reliability.

SUMMARY OF THE INVENTION

The present invention aims therefore at providing a dual-phase fluid passive cooling system that allows to dissipate a higher thermal power to the external environment, with the maximum temperature of the electronic apparatus remaining unchanged, that allows to reduce the local maximum temperature of the electronic apparatus, thereby improving the reliability and use-life of the electronic components of the apparatus, and that is equivalent to a constant-temperature heat capacity in case of a short-time increase in the dissipated power (the so-called "power peak").

This and other objects are fully achieved according to the present invention by virtue of a cooling system as described and claimed herein.

In short, the invention is based on the idea of providing a dual-phase fluid passive cooling system comprising at least one plate member, forming part of a casing inside which the apparatus is intended to be accommodated, and a fluid circuit provided in said plate member(s), wherein each plate member has a first side facing towards the apparatus (i.e. towards the inside of the casing) and a second side opposite to the first side (i.e. facing towards the outside of the casing), wherein the fluid circuit comprises a first duct formed on the first side of the plate member and extending along a first labyrinth path, and a second duct formed on the second side of the plate member and extending along a second labyrinth path, wherein the plate member has a first through hole and a second through hole through which the first duct and the second duct are in in fluid communication with each other, and wherein the fluid cir-cuit further comprises a porous separation element which is placed in the first through hole and through which a working fluid flows, by capillarity, from the second duct to the first duct, the working fluid being in vapour phase in the first duct and in liquid phase in the second duct.

BRIEF DESCRIPTION OF THE DRAWINGS

Further features and advantages of the invention will become more apparent from the following detailed description, given purely by way of non-limiting example with reference to the appended drawings, where:

FIG. 1 is a perspective view of the cooling system of the present invention, as viewed from the first side of the plate member;

FIG. 2 is a perspective view of the cooling system of the present invention, as viewed from the second side of the plate member.

DETAILED DESCRIPTION OF PREFERRED EMBODIMENTS

Figure 3:
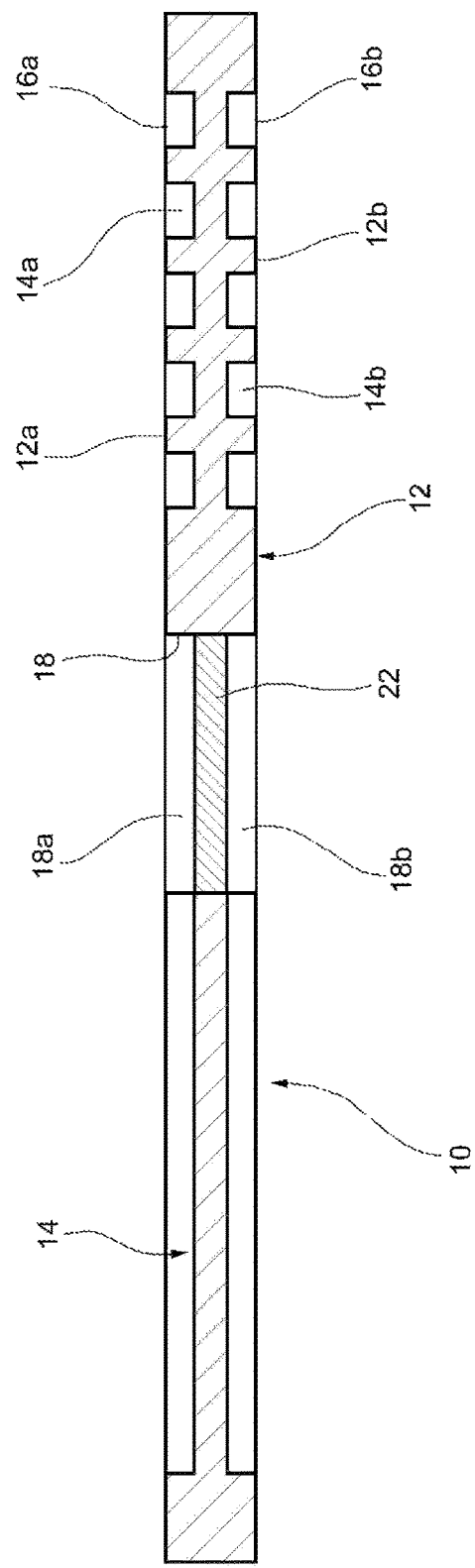
FIG. 3 is a section view, on an enlarged scale, of the cooling system of FIGS. 1 and 2, through the section plane indicated in FIG. 1.

With reference to the drawings, a dual-phase fluid passive cooling system according to the invention, hereinafter simply referred to as cooling system, is generally indicated 10. The cooling system has been conceived to be used to cool an electronic apparatus (not shown in the drawings), such as in particular an avionic apparatus for an aircraft, but—as will be apparent from the following description—may be used in many other applications.

The cooling system 10 comprises first of all a plate member 12 forming one of the walls of a casing intended to accommodate inside it the electronic apparatus. The plate member 12 is preferably made as a flat element. In the embodiment illustrated in the drawings, the plate member 12 is of square shape (or, more generally, of rectangular shape).

The plate member 12 has a first side 12*a* (shown in FIG. 1) which in the operating condition faces towards the electronic apparatus (i.e. to the inside of the casing) and a second side 12*b* (shown in FIG. 2), opposite to the first side 12*a* (and therefore facing to the outside of the casing, in the operating condition).

A fluid circuit 14 containing, as working fluid, a dual-phase fluid (for example water, ammonia, propylene, etc.) is formed in the plate member 12. The fluid circuit 14 comprises a first duct 14a and a second duct 14b communicating with each other. The first duct 14a is formed on the first side 12a of the plate member 12 and extends along a first labyrinth path, as shown in FIG. 1. The second duct 14b is formed on the second side 12b of the plate member 12 and extends along a second labyrinth path, as shown in FIG. 2. As shown in FIG. 3, a first film 16a for sealing the first duct 14a is attached to the first side 12a of the plate member 12 and, likewise, a second film 16b for sealing the second duct 14b is attached to the second side 12b of the plate member 12. Each of the labyrinth paths, along which the first and second ducts 14a, 14b run, extends substantially over the entire respective side 12a, 12b and is suitably shaped to make the temperature of the casing as uniform as possible.

The plate member 12 has a first through hole 18 and a second through hole 20, through which the first duct 14a and the second duct 14b are in fluid communication with each other. The first duct 14a extends, in the direction of the fluid flow through the same duct, from the first hole 18 to the second hole 20, while the second duct 14b extends, in the direction of the fluid flow through the same duct, from the second hole 20 to the first hole 18. The working fluid is in vapour phase in the first duct 14a and in liquid phase in the second duct 14b. In the first hole 18 a porous separation element 22 is arranged, through which the working fluid flows, by capillarity, from the second duct 14b to the first duct 14a. The portion of the first hole 18 facing towards the first side 12a, i.e. comprised between the porous separation element 22 and the first film 16a, acts, along with the first duct 14a, as an evaporator device, where the working fluid in liquid phase flowing from the second duct 14b through the porous separation element 22 receives the heat dissipated by the electronic apparatus and evaporates. The second duct 14b acts as a condenser device, where the working fluid in vapour phase flowing from the first duct 14a through the second hole 20 releases the heat to the outer environment, thereby returning to the liquid phase. The portion of the first hole 18 facing towards the second side 12b, i.e. comprised between the porous separation element 22 and the second film 16b, acts as a compensation chamber where the working fluid in liquid phase is collected before flowing by capillarity through the porous separation element 22.

Although in the drawings only one plate member 12 is shown, the cooling system may comprise more plate members 12 provided with a fluid circuit 14 as the one described above, so as to be able to dissipate a higher thermal power (as the dissipated thermal power is proportional to the surface of the plate members).

The cooling system 10 operates as follows.

The working fluid in liquid phase that is in the second duct 14b of the circuit 14 flows by capillarity through the porous separation element 22 and reaches the first duct 14a, where it is transformed to vapour phase by virtue of the heat received by the electronic apparatus (to which that duct is facing). The working fluid in vapour phase flows then in the first duct 14a from the first hole 18 to the second hole 20 and, through the second hole 20, returns into the second duct 14b. As the working fluid flows along the second duct 14b from the second hole 20 to the first hole 18, it discharges heat to the outer environment and is transformed from vapour phase to liquid phase, and finally returns, through the porous separation element 22, again into the first duct 14a.

The cooling system according to the invention offers a number of advantages over the known passive cooling systems using a dual-phase fluid.

First of all, the cooling system proposed herein does not require a specific free space available, as it is wholly formed within the thickness of one or more walls of the casing inside which the electronic apparatus is accommodated in use.

Secondly, the cooling system of the present invention is easy and not expensive to manufacture, as it only requires the steps of forming the first and second ducts, as well as the first and second holes, in the plate member, filling the first and second ducts with the working fluid, and finally attaching (for example by glue) the first and second films to the first and second sides of the plate member, respectively.

Furthermore, the cooling system of the present invention allows to absorb the peaks of dissipated thermal power keeping the temperature substantially constant, through the evaporation, as well as to dissipate to the outer environment a higher thermal power (which is proportional to the surface of plate member(s)), the maximum temperature of the electronic apparatus remaining unchanged, by virtue of the temperature on the plate member(s) being uniform.

Naturally, the principle of the invention remaining unchanged, the embodiments and the constructional details may vary widely from those described and illustrated purely by way of non-limiting example.

What is claimed is:

1. A cooling system for cooling an electronic apparatus, the cooling system comprising
   at least one plate member forming a wall of a casing inside which the apparatus is intended to be accommodated in use, said at least one plate member having a first side facing in use towards the apparatus and a second side opposite to the first side, and
   a fluid circuit formed in said at least one plate member, wherein the fluid circuit comprises a first duct formed on the first side of said at least one plate member and extending along a first labyrinth path and a second duct formed on the second side of said at least one plate member and extending along a second labyrinth path,
   in that said at least one plate member has a first through hole and a second through hole, through which the first duct and the second duct are in in fluid communication with each other, and
   wherein the fluid circuit further comprises a porous separation element which is placed in the first through hole and through which a working fluid flows by capillarity from the second duct to the first duct, the working fluid being in vapour phase in the first duct and in liquid phase in the second duct.

2. The cooling system of claim 1, further comprising a first film attached to the first side of said at least one plate member to seal the first duct, as well as the first and second holes, and a second film attached to the second side of said at least one plate member to seal the second duct, as well as the first and second holes.

* * * * *